United States Patent [19]
Wark

[11] Patent Number: 5,984,164
[45] Date of Patent: Nov. 16, 1999

[54] METHOD OF USING AN ELECTRICALLY CONDUCTIVE ELEVATION SHAPING TOOL

[75] Inventor: James M. Wark, Boise, Id.

[73] Assignee: Micron Technology, Inc., Boise, Id.

[21] Appl. No.: 08/961,758

[22] Filed: Oct. 31, 1997

[51] Int. Cl.$^6$ .......................... B29C 59/02; B23K 31/02
[52] U.S. Cl. ..................... 228/164; 228/254; 264/104; 264/322; 438/614
[58] Field of Search ................... 264/104, 105, 264/266, 320, 322, 323, 325; 228/254, 246, 164 OR; 438/614

[56] References Cited

U.S. PATENT DOCUMENTS

| | | | |
|---|---|---|---|
| 3,392,442 | 7/1968 | Napier et al. | 438/614 |
| 4,545,610 | 10/1985 | Lakritz et al. | 438/614 |
| 4,661,192 | 4/1987 | McShane | 156/292 |
| 4,752,027 | 6/1988 | Gschwend | 228/180.2 |
| 5,119,240 | 6/1992 | Marion et al. | 228/254 |
| 5,213,713 | 5/1993 | Reitz | 252/500 |
| 5,237,269 | 8/1993 | Aimi et al. | 324/158 R |
| 5,435,482 | 7/1995 | Variot et al. | 228/254 |
| 5,660,321 | 8/1997 | Ishida et al. | 228/254 |
| 5,745,986 | 5/1998 | Variot et al. | 228/254 |
| 5,762,259 | 6/1998 | Hubacher et al. | 228/254 |
| 5,762,845 | 6/1998 | Crumly | 264/104 |
| 5,829,668 | 11/1998 | George et al. | 228/254 |

OTHER PUBLICATIONS

Jan Vardaman, *What Does a CSP Cost?*, Advanced Packaging's Guide to Emerging Technologies, Emerging Technologies, pp. 3–4. Jul./Aug. 1997.

Alpha Metals, Inc., *The Ball Grid Array Primer*, Sep. 1996.

Chip Scale BGA, Smaller IC Packages for bigger Performance, amkor/anam, Super BGA® & IC Packaging For Super BGA®, (advertisement) (no date).

*Primary Examiner*—Angela Ortiz
*Attorney, Agent, or Firm*—Workman, Nydegger & Seeley

[57] ABSTRACT

The present invention relates to a solder ball shaping tool and a method for using the tool. In a substrate there is formed a series of depressions. The tool is pressed onto a ball grid array and the ball grid array is realigned either with simple pressure or pressure assisted by heating. Where a solder ball may have been deposited upon a die or a chip package in a diameter that exceeds that of the designed diameter, a corral tool is used to substantially conform the solder ball to design dimensions and a design location. As the corral tool is pressed against the solder ball, portions of the solder ball will reflow both into the substrate depression and into the corral. Where the total volume of the solder ball does not exceed that of both the corral and the substrate depression, the corral tool is adequate to achieve a designed solder ball height.

13 Claims, 6 Drawing Sheets

METHOD OF USING AN ELECTRICALLY CONDUCTIVE ELEVATION SHAPING TOOL

BACKGROUND OF THE INVENTION

1. The Field of the Invention

The present invention relates to semiconductor chip packaging. More particularly, the present invention relates to realigning and reshaping of solder balls or conductive bumps in an array upon a chip or die prior to final packaging. In particular, the present invention relates to a solder ball shaping tool and a method of using the tool to reshape and realign solder balls in an array that may have been misaligned either during solder ball deposition or during handling.

2. The Relevant Technology

In the field of chip packaging, a goal for those skilled in the art is to miniaturize the chip package, such as in chip scale packages (CSP) where the chip itself is not much smaller than its package. Various methods have been proposed to eliminate wire bonding and to achieve lead on chip (LOC) wiring as a means of decreasing chip packaging size. Traditionally, connections have been achieved by connecting a bonding wire from a bonding pad on the chip to a lead finger. However, wire bonding is time consuming and costly, particularly as the number of inputs and outputs from a single chip increases.

As integrated circuit technology advances, other methods of connecting input and output from a chip to the external world must be explored to facilitate miniaturization. Solder balls, also called solder bumps, are generally intended to all be of substantially the same size. For example, the solder balls may be about 0.3 to 0.4 millimeters in diameter where they contact the bottom of the package surface. Generally an array of electrical contacts congruent to the solder ball array is to be found on a circuit board to which the package is to be mounted. The solder balls individually contact their corresponding pads on the circuit board. In order to assure adequate contact, solder paste is often required to accommodate for variations and discrepancies between solder ball sizes and solder ball locations. After contact, the circuit board and the chip are placed in a solder reflow furnace, under conditions sufficient to cause the solder ball to reflow and coalesce within the solder paste in order to form an adequate electrical connection.

One method of forming solder paste on a printed circuit board (PCB) is to use silk-screening techniques to deposit solder paste onto the PCB. Where a silk-screening stencil is substantially adequate in its location of positioning solder paste onto the PCB, the problem of getting substantially uniform solder paste bumps remains, due to uneven distribution of solder paste and pressures during the silk-screening process. An alternative method of depositing solder paste is multi-point deposition of solder paste globules. As each solder paste globule is deposited, size variations occur that may cause shorting between neighboring sites.

One method of forming solder bumps comprises stencil or screen printing or dispensing of solder paste in a desired pattern on the package substrate followed by reflowing to provide rounded solder bumps. Maintaining accurate placement of the chip is difficult and the reliability of electrical connections between solder bumps and contact pads is reduced due to misplacement of the solder bumps. Additionally, variation in location in discrepancy in shape of solder bumps makes it difficult and time consuming to effectively make all electrical connections.

Conventionally, solder bump reflowing is used to mount a chip or chip package onto a PCB. A degree of dimensional variation occurs with solder bumps in the prior art. Reliability in the mounting and electrical connection of integrated circuit packages to their mounting boards is important because the solder joints between the contacts of the chip and those of the circuit board are highly difficult to visually inspect and non-destructively test once the chip is in place on the PCB. Although statistical methods of quality control along with destructive testing methods must be relied upon to provide confidence that reliable electrical connections are being made, more effective methods are being sought.

PCBs are typically made of laminated layers and organic resins. Plastic or organic substrates have a drawback of dimensional instability such as warpage and bowing. Warpage and bowing cause additional challenges in effectively making electrical connection between the PCB and the chip package. When an integrated circuit package with an array of solder balls is placed against a PCB, if the package and PCB are sufficiently coplanar, then each of the solder balls will contact its corresponding contact pad.

A bowed or warped PCB or integrated circuit package may be sufficiently deformed so as to prevent effective electrical contact between solder paste and the solder balls. FIG. 1 illustrates one of the problems associated with a bowed or warped chip package. In an exaggerated illustration seen in FIG. 1, integrated circuit package 10 containing a chip 8 is shown as being warped when viewed in cross-section. In FIG. 1 it can be seen that integrated circuit package 10 is being placed in proximity to a PCB 16. Upon PCB 16 there is an array of pads 18 that correspond to an array of solder balls 12 upon integrated circuit package 10. Solder ball 12 is disposed upon a lower surface 14 of integrated circuit package 10 in an array that follows the warpage thereof. It can be seen that a degree of warpage, W, may be quantified as approximately the distance between a low spot, L, on lower surface 14 and approximately the center of integrated circuit package 10. It can be seen that upon assembly of integrated circuit package 10 with PCB 16, low spot L will likely contact PCB at a corresponding pad 18 but a high spot, H on lower surface 14, will likely not make contact thereto. An attempt to force PCB 16 into high spot H may cause solder ball 12 at low spot L to substantially flatten to the point that it will short into an adjacent solder ball. Reduction of size of solder ball 12 may alleviate the problem of solder ball flattening and subsequent shorting into an adjacent solder ball. However, reduction of size of solder ball 12 in the area of high spot H will likely prevent making an electrical contact to PCB 16.

In an attempt to compensate for a warped integrated circuit package, a larger solder ball may be deposited. However, as the pitch between adjacent solder balls in a ball grid array (BGA) decreases due to smaller packaging techniques, a larger solder ball that is substantially flattened during mating of a BGA to a pad array, in relationship to other solder balls, may cause a short between solder balls. Thus, non-planarity of both the PCB and integrated circuit package and dimensional variability of solder balls among themselves all contribute to the problem of defectively connecting a chip package to a PCB.

In situations where a BGA is uniformly and substantially precisely set down upon a grid within design tolerances, subsequent handling steps can damage, deform and displace any or all of the solder balls. In FIG. 1, it can be seen that a design distance, $d_0$ describes spacing between two solder balls 12. Displacement of a solder ball during subsequent handling steps will cause variations such as a spacing less than $d_0$, $d_1$, and a spacing greater than $d_0$, $d_2$.

Handling steps include chip singulation, marking, and testing such as burn-in. One technique that has been used in the prior art to reclaim the design shape of a solder ball is to reflow the solder ball through a thermal process. One problem with a thermal reflow process is that a given chip or array thereof may be at or near the end of its fabrication processing thermal budget and any further thermal processing will compromise the quality or reliability of the chip or chip array.

What is needed in the art is a tool that effectively shapes and sizes solder balls. What is also needed in the art is a tool that effectively restores shapes and sizes of individual solder balls within an array to their designed location and height to prevent electrical shorting inherent in smaller packaging and increasingly finer pitch of solder balls.

SUMMARY OF THE INVENTION

The present invention relates to an electrically conductive elevation shaping tool and a method for using the tool. Examples of an electrically conductive elevation are a solder ball or solder bump, a conductive polymer bump, a gold bump, and the like. For convenience, reference to electrically conductive elevations will be done by using the term solder ball unless otherwise noted. Following routine procedures such as testing, marking, and burn-in, the present invention is used to restore the BGA to its design parameters.

In a substrate there is formed a series of depressions. The substrate forms part of a tool that is to be aligned over an array of solder balls. The tool is pressed onto the integrated circuit package, if the BGA is arrayed on an integrated circuit package, and the BGA is realigned either with simple pressure or pressure assisted by heating. In one embodiment, a truncated pyramid depression shape is used to reshape a solder ball. In other embodiments, a preferred depression shape may include a hemisphere depression, a pyramid depression, a cylinder-end depression, and the like.

Where a solder ball may have been deposited upon a die in a diameter that exceeds that of the designed diameter, a corral tool is used to substantially conform the solder ball to design dimensions and a design location. As the corral tool is pressed against the solder ball, portions of the solder ball will reflow both into the substrate depression and into the corral. Where the total volume of the solder ball does not exceed that of both the corral and the substrate depression, the corral tool is adequate to achieve a designed solder ball height.

Where the solder ball is misaligned in the X-Y dimension (the Z dimension being vertical), pressure of the corral tool against the solder ball will cause the solder ball to plastically deform and/or reflow in a X-Y direction toward the center of the substrate depression.

Where a solder ball has a substantial adhesive affinity or capability of wetting silicon, polysilicon, or a material that forms the substrate, a liner layer may be formed upon the substrate. Where the substrate has a first adhesive affinity to the solder ball, the liner layer is selected to have a second adhesive affinity to the solder ball. The first adhesive affinity is greater than the second adhesive affinity. Preferably, the affinity of the liner layer to wet a solder ball or the like will be substantially insignificant in comparison to the affinity of the material that forms the substrate. Examples thereof include aluminum, tungsten and the like. Alternatively, a substrate may be chosen without a liner layer that likewise has a substantially insignificant affinity for allowing a solder ball to wet thereupon.

Where a corral tool configuration, in spite of its capacity to reshape the solder ball without causing shorting to a neighboring solder ball is insufficient to accomplish that end, a vented corral tool may be used. The vented corral tool includes a wetting channel that has a first adhesive affinity to the solder ball that is greater than the second adhesive affinity to the solder ball of the liner layer. As the vented corral tool is pressed against the solder ball, excess solder ball material at or near reflow temperatures flows or moves beyond the boundary of the depression and is drawn into the wetting channel.

The tool may be as simple as a single tool with a single depression therein, such as a tool that can be articulated among an array of solder balls upon a die or a chip package by use of an 3-dimensional motion robot arm. The tool may also include an array of depressions that substantially matches a solder ball array on a single die or on a single chip package. Alternatively, the tool may include an array of tools that substantially matches an array of dice upon a wafer before singulation or that substantially matches an array of chip packages on a PCB panel before singulation.

In a method of processing a solder ball array according to the present invention, a plurality of tools having an array of depressions, each tool having a depression size smaller than the previous, is sequentially applied to a solder ball array to substantially realign and reshape solder balls that are misaligned.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

The present invention relates to an electrically conductive elevation shaping tool and a method for using the tool. Following routine procedures such as testing, marking, and burn-in the present invention can be used to restore the BGA to its design parameters. For convenience, the electrically conductive elevation will be referred to throughout as solder ball 12. However, it is understood that solder ball includes solder bumps, solder balls, conductive polymer bumps, gold bumps, and the like.

Figure 2:
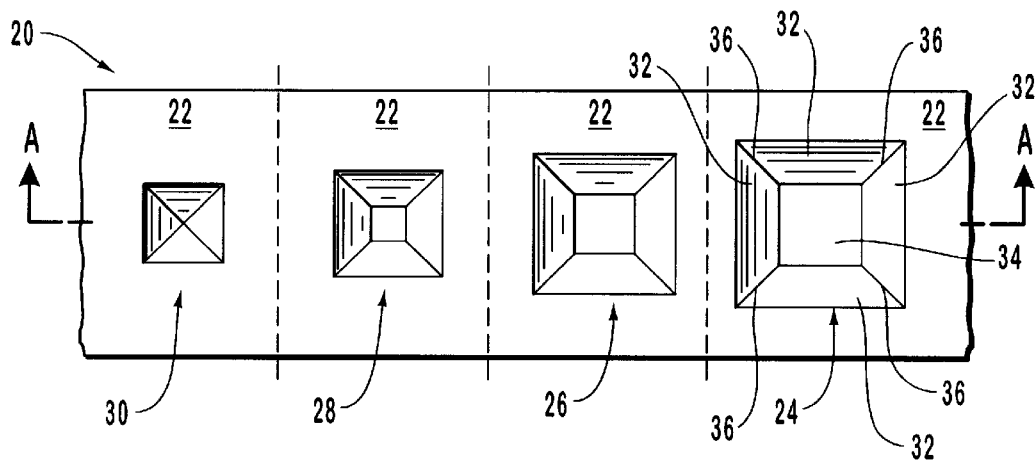
FIG. 2 is plan view of an embodiment of the inventive tool, wherein depressions of various configurations are illustrated as alternatives of the inventive electrically conductive prominence reshaping tool.

FIG. 2 illustrates a bottom plan view of an embodiment of the present invention. In FIG. 2 it can be seen that a tool 20 has been provided that consists of a substrate 22 which may be, by way of nonlimiting example, monocrystalline silicon or polycrystalline silicon. In substrate 22 there is formed a series of depressions including a first depression 24, a second depression 26, a third depression 28, and an Nth depression 30. First depression 24 illustrates additional features for a preferred embodiment of the present invention. It can be seen within first depression 24 that a depression wall 32 and a depression bottom 34 are included within first depression 24. In this embodiment, where first depression 24 forms a truncated pyramid depression shape, there exists a miter joint shape 36 between two adjacent structures of depression wall 32. Miter joint shape 36 is merely a shape and not a joint, as miter joint shape 36 is preferably formed entirely out of substrate 22. Thus, depression wall 32 consists of four substantially planar wall surfaces with miter joint shape 36 being the boundary of any two of such substantially planar wall surfaces.

Although tool 20 is illustrated as having first depression 24 through Nth depression 30 being of differing sizes in the same tool, a given tool can have an array of depressions that are substantially the same in size and configuration (i.e., depth, width, shape, etc.). Thus, vertically-drawn dash lines indicate differentiation of different tools. Tool 20 is used by aligning it below an array of solder balls, such as placing tool 20 or integrated circuit package 10 into a fence and then pressing. Sight alignment techniques may also be used such as a visual scan of the array that recognizes the BGA pattern and then places tool 20 upon the array in a manner that optimizes alignment of solder ball 12 with the depressions may also be used. Tool 20 is then pressed against integrated circuit package 10, if the BGA is arrayed on an integrated circuit package, and the BGA is realigned either with simple pressure or pressure assisted by heating.

Figure 3:
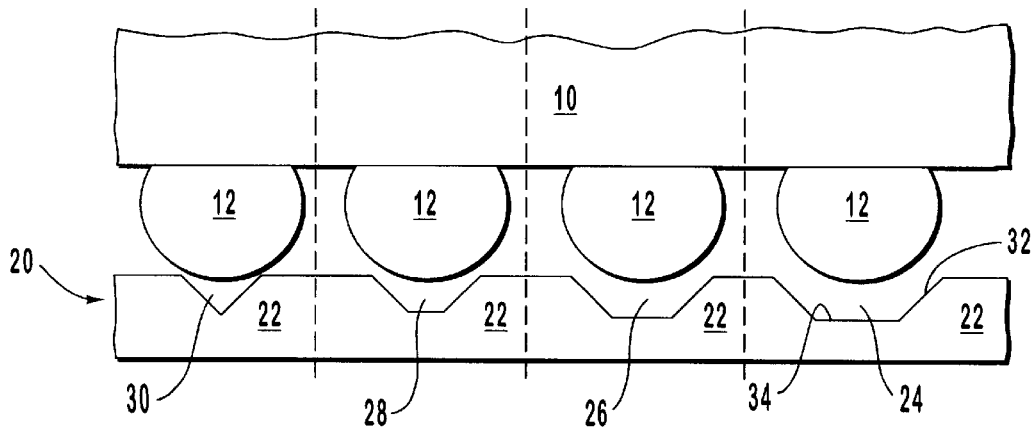
FIG. 3 is an elevational cross-section view of the tool depicted in FIG. 2, wherein it can be seen that the depressions form openings of various widths in relation to a solder ball width.

FIG. 3 illustrates tool 20 of FIG. 2 in elevational cross-section. In first depression 24, a truncated pyramid depression shape in substrate 22 is depicted. Where a solder ball may have a width in the range from about 100 to about 1,000 microns, the width of the truncated pyramid shape will be proportionally as wide. Second depression 26 illustrates a truncated pyramid shape with solder ball 12 above it that has a width greater than the width of second depression 26. In third depression 28, solder ball 12 has a width that exceeds all portions of any width of third depression 28. In Nth depression 30, solder ball 12 has a width that begins to approach twice the width of Nth depression 30. Where solder ball 12 has a width of 300 microns, it can be seen that during the process of pressing solder ball 12 into first depression 24, first depression 24 with a width of 300 microns substantially equals the width of solder ball 12. An alternative embodiment is illustrated in FIG. 3, wherein third depression 28 has an opening of 250 microns and solder ball 12 has a width that exceeds the width of third depression 28 by about 50 microns.

Figure 4:
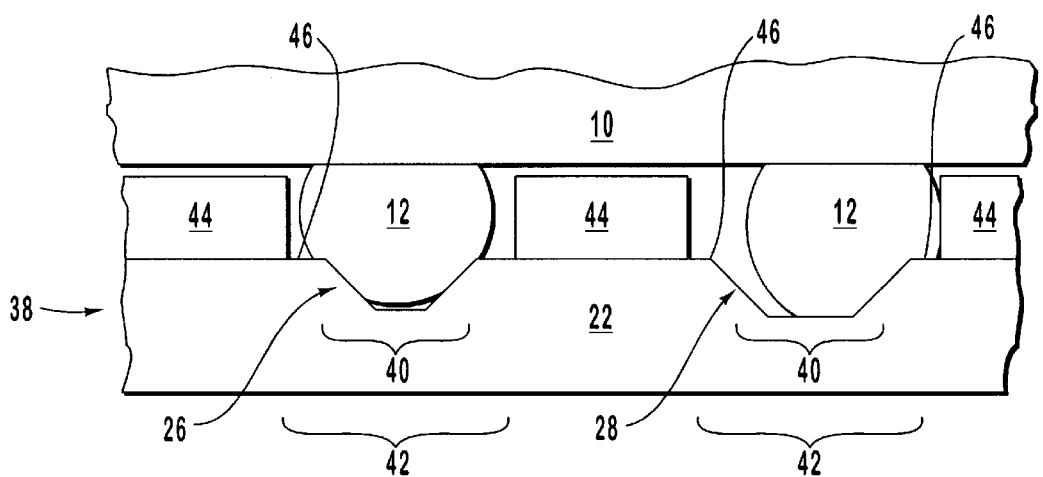
FIG. 4 is an elevational cross-section view of an embodiment of the present invention that includes both a depression and a corral and wherein the corral is used to reshape and re-align the solder ball array.

References in the Figures refer to the vertical dimension, such as in FIG. 3 as an axis in the plane of the page that runs from top to bottom thereof, to be the Z-dimension. The X-dimension is understood to be the dimension coming perpendicularly out of the plane of the page. The Y-dimension is understood to be an axis substantially within the plane of the page and moving from right to left thereon.

Where solder ball 12 may have been deposited upon a die or substrate in a diameter that exceeds that of the designed diameter, a corral tool 38, as seen in FIG. 4, is used to substantially conform solder ball 12 to design dimensions and a design location. As corral tool 38 is pressed against solder ball 12, portions of solder ball 12 will reflow both into a substrate depression 40 and into a corral 42. Where the total volume of solder ball 12 does not exceed that of both corral 42 and substrate depression 40, corral tool 38 is adequate to achieve a designed solder ball height in the Z-dimension.

Where solder ball 12, as seen immediately above third depression 28 in corral tool 38 is misaligned in the X-Y dimension, pressure of corral tool 38 against solder ball 12 will cause solder ball 12 to plastically deform and/or reflow in the X-Y dimension in a direction toward the center of third depression 28. Although solder ball 12 within third depression 28 may not be substantially centered, the effect of deformation and/or reflow of solder ball 12 substantially toward the center of third depression 28 will in some applications be sufficient to restore solder ball 12 both to design height (Z) and design location (X-Y).

Corral tool 38 has an elevation 44 that extends above a tool upper surface 46 of corral tool 38. Elevation 44 may be manufactured from epitaxial polycrystalline silicon disposed upon tool upper surface 46 of corral tool 38. Other materials may also be used to form elevation 44 such as a polyamide or a photoresist-type material that can be cured and hardened to remain upon tool upper surface 46. Elevation 44 can be made from a suitable material such as plastics including polytetrafluoroethylene (PTFE), polyamids, and photoresist material. Elevation 44 may also be made from such inorganic materials as silicon nitride, silicon carbide, silicon carbon nitride, and silicon oxide. Elevation 44 may also be made from polysilicon such as P-doped polysilicon, N-doped polysilicon, Group 4A-doped polysilicon, mixtures thereof, and undoped polysilicon. In selecting an appropriate material for elevation 44, the material is preferably resistant to thermal degradation at or near solder ball reflow temperatures, and also substantially resistant to brittle failure due to incidental pressure caused during pressing corral tool 38 upon a BGA. Alternatively, both substrate 22 and elevation 44 may be manufactured from a single monocrystalline silicon piece. Fabrication of corral 42 and substrate depression 40 may be accomplished, by way of non-limiting example by etching techniques known in the art.

Where substrate 22 of tool 20 or corral tool 38 is formed from monocrystalline silicon, the shape of any depression therein may be dictated by etching along crystal planes. Elevation 44 is not necessarily limited to crystal planes in its preferred shape. Thus, where a first depression 24, etc. forms a pyramid or truncated pyramid shape in substrate 22, elevation 44 may have a substantially circular shape or a geometric shape to complement the shape of substrate depression 40.

Figure 5:
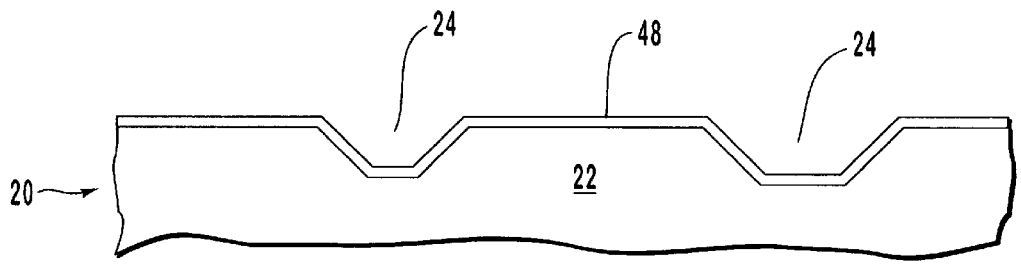
FIG. 5 is an elevational cross-section view of another embodiment of the present invention, wherein the tool includes a depression and a liner layer that is disposed substantially conformably within the depression and that has a resistance to adhesion with the electrically conductive elevation such as a solder ball; the substrate has a first adhesive affinity for the electrically conductive elevation and the liner layer has a second adhesive affinity for the electrically conductive elevation that is substantially less than the first adhesive affinity.
Figure 6:
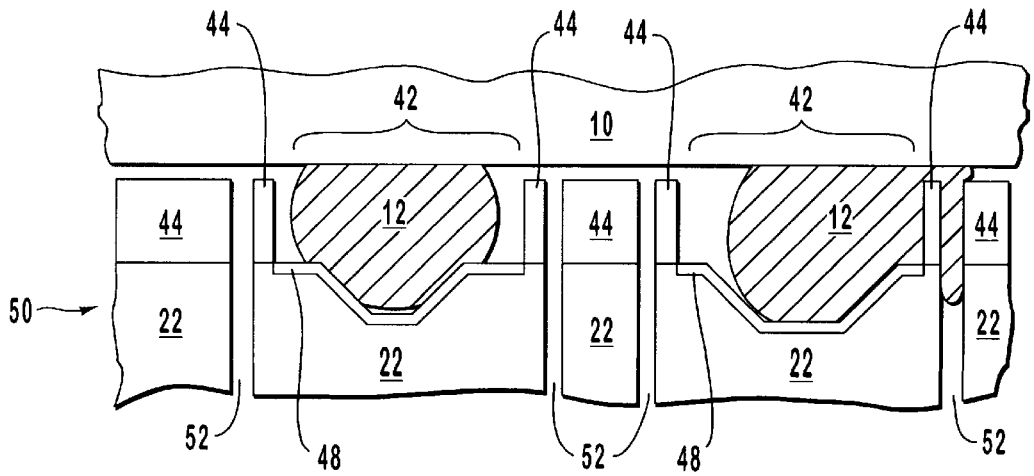
FIG. 6 is an elevational cross-section view of another embodiment of the present invention, wherein a wetting channel circumscribes the corral; the wetting channel has a first adhesive affinity for the electrically conductive elevation in reflow and the liner layer has a second adhesive affinity for the electrically conductive elevation in reflow.

Substrate 22 may be made of any suitable material, silicon and polysilicon being preferred. As seen in FIG. 5, where a solder ball has a specific adhesive affinity or wetting capability to silicon or polysilicon or a material that is preferred in a specific application that forms substrate 22, a liner layer 48 may be formed upon substrate 22. Substrate 22 is selected to have a first adhesive affinity to solder ball 12 and liner layer 48 is selected to have a second adhesive affinity to solder ball 12. The first adhesive affinity for solder ball 12 will be greater than the second adhesive affinity for solder ball 12. The adhesive affinity of any material for solder ball 12 may be described as a tendency for solder ball 12 to wet that material during reflow or a tendency for solder ball 12 to adhere to that material during substantial contact therebetween. A preferred second adhesive affinity material that is used to form liner layer 48 for solder ball 12 is understood to be a material that will form a wetting contact angle of less than 90° for a solder ball substantially at its liquidus temperature if a metal, or its plastic gravity-induced reflow temperature if a plastic resin or the like. In other words, solder ball 12, when placed on material used to form liner layer 48 under these conditions will tend to "bead up" instead of spread out. Although a preferred second adhesive affinity material will have a wetting contact angle of a solder ball substantially at the liquidus temperature or the like that is less than 90°, a preferred first adhesive affinity material may also have a contact angle less than 90° at substantially similar conditions. In such a case, a preferred second adhesive affinity material will have a contact wetting angle even smaller than the contact wetting angle of the preferred first adhesive affinity material. In a more preferred embodiment, a characteristic preferred contact wetting angle of liner layer 48 is less than 60°, even more preferably less than 30°, and most preferably less than 10°.

Where a corral tool configuration, in spite of its capacity to reshape solder ball 12 without causing shorting to a neighboring solder ball is insufficient to accomplish that end, a vented corral tool 50 as illustrated in FIG. 6 may be used. Vented corral tool 50 includes liner layer 48 as an option and a wetting channel 52. Wetting channel 52 has a first adhesive affinity to solder ball 12 that is greater than the second adhesive affinity to solder ball 12 than that of liner layer 48. As vented corral tool 50 is pressed against solder ball 12, excess solder ball material at or near reflow temperatures spills beyond the boundary of corral 42 and is forced into wetting channel 52 by pressure, drawn by vacuum action, by wicking action, or by other forces such as capillary action.

In any embodiment of the present invention, where a tool has a vented portion that may convey excess solder material away from a given solder bump, the tool may be configured to have sufficient capacity within a vent or in a reservoir connected to the vent to process an entire given batch of substrates caring an array of solder balls. Alternatively, a series of tools may be configured such that where a second tool is in use to realign and reshape solder balls, a first tool is off line and is being substantially cleaned of any solder ball material that may have been drawn into a wetting channel or accumulated thereon by other means. Under this scheme, a given plurality of tools may be cycling through a process of being used to realign and reshape a solder ball array, being cleaned of substantially all solder ball material, and being prepared to realign and reshape a given array of solder balls. With or without wetting channel 52, a tool of the present invention may be used in rotation with other tools of like or different configuration to be substantially cleaned and brought back on-line.

Figure 7:
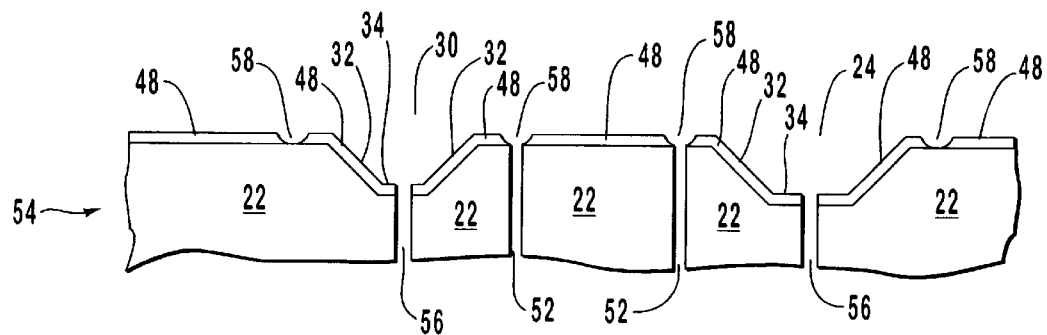
FIG. 7 is an elevational cross-section view of another embodiment of the present invention, wherein the inventive tool includes an electrically conductive elevation depression, a wetting channel trench that both circumscribes the electrically conductive elevation depression and is configured to convey excess portions of the electrically conductive elevation in reflow away from the depression, and wherein a second wetting channel is located at the bottom of the depression to facilitate removal of excess electrically conductive elevation material in reflow.

FIG. 7 illustrates in an alternative embodiment of the present invention, wherein a vented tool 54 has both wetting channel 52 and a second wetting channel 56 that is located at the bottom of first depression 24. It can be readily understood that vented tool 54 may be configured with wetting channel 56 alone, in combination with second wetting channel 56, or with second wetting channel 56 alone. Where vented tool 54 has wetting channel 52, a trench 58 that surrounds first depression 24 may be part of wetting channel 52. A plurality of wetting channels lead out of trench 58 in a direction away from tool upper surface 46. In FIG. 7, it can be seen in cross-section that wetting channel 52 is depicted with trench 58 surrounding first depression 24 to Nth depression 30 and a single wetting channel 52 is exposed near each depression in this cross-sectional view.

Figure 8:
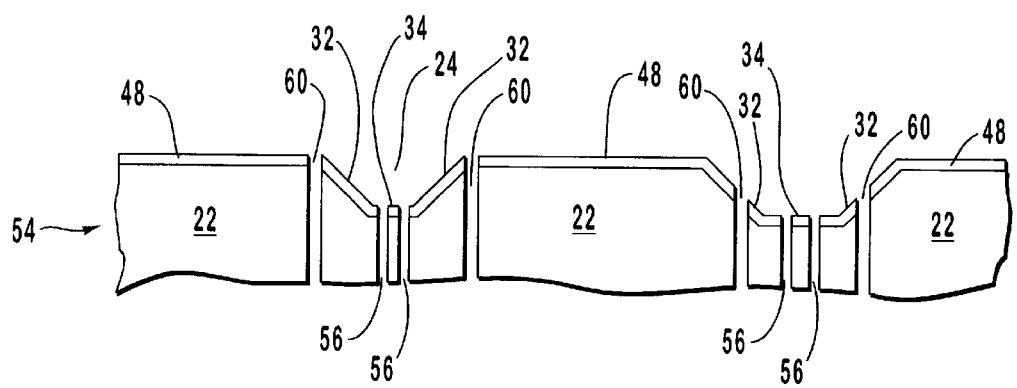
FIG. 8 is an elevational cross-section view of another embodiment of the present invention, wherein a wall diagonal wetting channel is located along the side of the depression, and wherein a second wetting channel is located at the bottom of the depression.

FIG. 8 illustrates yet another embodiment of the present invention wherein a wall diagonal wetting channel 60 forms an opening against the depression wall 32 of vented tool 54. Vented tool 54 may include second wetting channel 56 as illustrated, and may also include liner layer 48.

Figure 9:
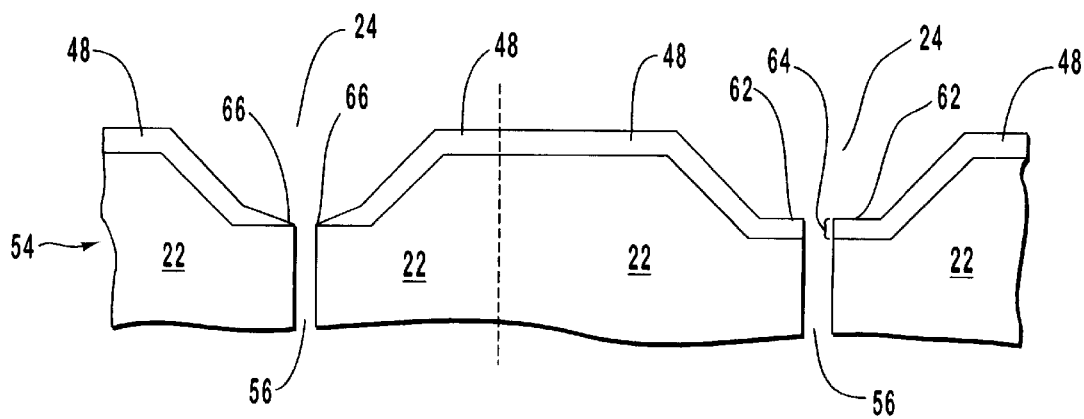
FIG. 9 is an elevational cross-section view of another embodiment of the present invention, wherein the liner layer is depicted as having either a right angle edge at the wetting channel opening to resist substantial flow of a solder ball in reflow into the wetting channel or a beveled edge to facilitate substantial removal of electrically conductive elevation material into the wetting channel where excess electrically conductive elevation material is found.

FIG. 9 illustrates another embodiment of the present invention. It can be seen that liner layer 48 can be configured with either a substantially right angle edge 62 that has an edge height 64 or with a beveled edge 66 that has substantially no edge height. During reflow of solder ball 12, edge height 64 when used, will resist flow of solder ball 12 into second wetting channel 56. Resisting reflow of solder ball 12 into second wetting channel 56 is desirable where solder ball 12 has a height configuration such that it does not exceed design tolerances but another solder ball on the BGA does exceed design tolerances. Beveled edge 66 facilitates flow of solder ball 12 into second wetting channel 56 when the height of solder ball 12 is substantially greater than design tolerances. It can be appreciated that right angle edge 62 and/or beveled edge 66 may be placed at any location within first depression 24 to Nth depression 30 (not illustrated) to accompany a wetting channel.

Figure 10:
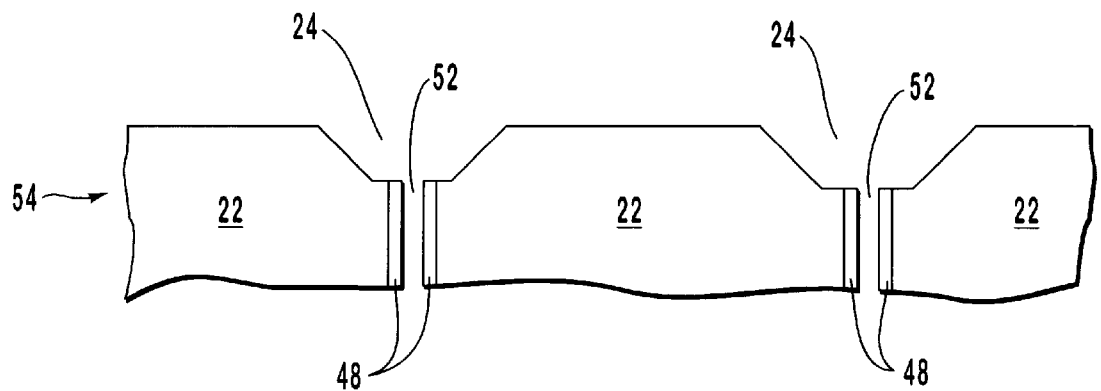
FIG. 10 is an elevational cross-section view of another embodiment of the present invention, wherein the liner layer is depicted as being substantially within the wetting channel; the wetting channel having a first adhesive affinity for the electrically conductive elevation in reflow by virtue of the liner layer, the depression having a second adhesive affinity for the electrically conductive elevation in reflow, and wherein the first adhesive affinity is substantially greater than the second adhesive affinity.

FIG. 10 illustrates another embodiment of the present invention in which vented tool 54 includes first depression 24 to Nth depression 30 and wetting channel 52 has been formed with liner layer 48 therewithin. In this configuration, liner layer 48 has a first adhesive affinity for solder ball 12 and substrate 22 has a second adhesive affinity for solder ball 12 as herein defined. Processing to form liner layer 48 within wetting channel 52 can be carried out according to layer formation methods known in the art such as chemical vapor deposition (CVD). Liner layer 48 may be made from any suitable material that will facilitate degradation during use of tool 20 and that will substantially resist wetting or adhesive contact to solder ball 12. Liner layer 48 may be made from aluminum, copper, silver, or refractory metals, either alone or in combination. Preferred refractory metals include titanium, tungsten, cobalt, and niobium. Liner layer 48 may be also made from refractory metal nitrides. Preferred refractory metal nitrides include tungsten nitride, titanium nitride, titanium tungsten nitride, cobalt nitride, and tantalum nitride. Additionally, liner 48 may be made from the same preferred materials that are used to manufacture elevation 44 as set forth herein.

Figure 11:
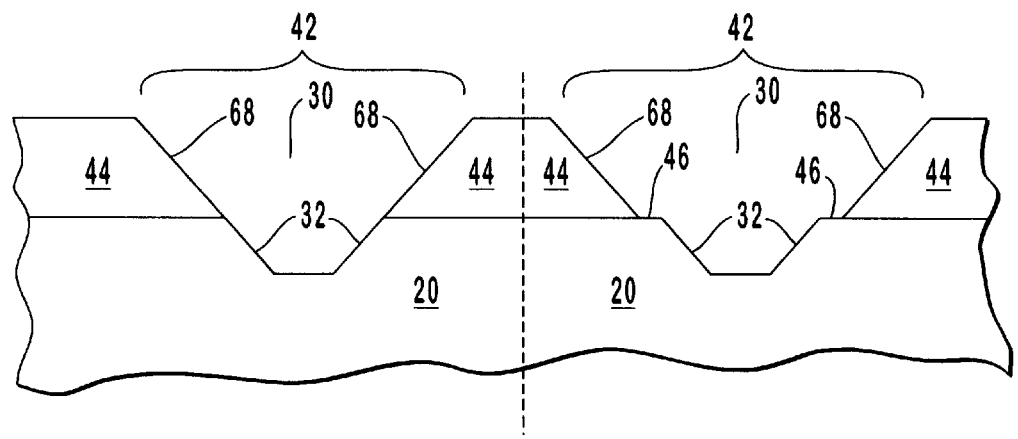
FIG. 11 is an elevational cross-section view of an embodiment of the inventive tool being used in an inventive method, wherein a series of successively smaller-width corrals is applied to the electrically conductive elevation to achieve a designed electrically conductive elevation location and electrically conductive elevation size.

In another embodiment of the present invention, corral 42 may be formed wherein elevation 44 has a corral wall 68 that has a slope substantially the same as the slope of the depression wall 32 as illustrated in FIG. 11. FIG. 11 illustrates yet another alternative of the present invention on the right side of the vertical dashed line wherein corral wall 68 of elevation 44 is initially backset from depression wall 32 of first depression 24. By use of the inventive method, elevation 44 may be progressively advanced toward depression wall 32 by using a series of tools that have increasingly coplanar corral and depression walls until corral wall 68 is substantially coplanar with depression wall 32 as illustrated in Nth depression 30 on the left side of the vertical dashed line. It can be appreciated that corral wall 68 may initially be formed substantially perpendicularly to tool upper surface 46 or may initially be set at an angle substantially similar to that of depression wall 32 or any angle between coplanarity and perpendicular to tool upper surface 46.

The tool may be as simple as a single tool with a single depression therein, whereby the tool is articulated among an array of solder balls by use of a 3-dimensional motion robot arm or tray handling devices. The tool may include an array of depressions that substantially matches a solder ball array on a single die, a single integrated circuit package, or a single substrate such as a PCB. Also, the tool may include an array of tools that substantially matches an array of dice upon a wafer before singulation.

Figure 12:
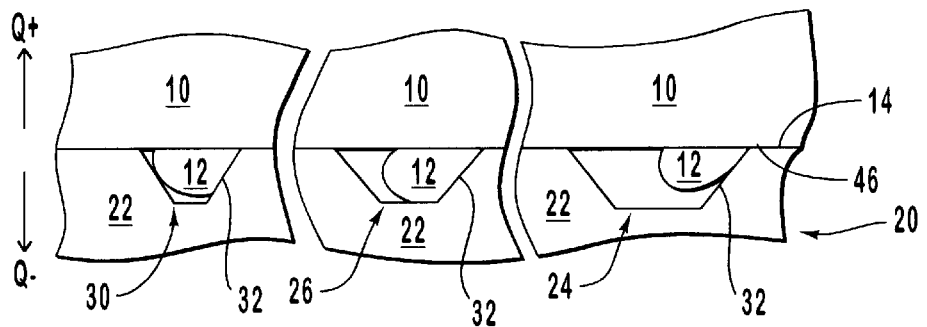
FIG. 12 is an elevational cross-section view of a motion study of three possible steps in the inventive method, wherein an electrically conductive elevation is realigned and reshaped in a plurality of stages that includes increasingly tighter depression-to-elevation tolerances.

FIG. 12 illustrates, by way of motion study, a method of processing a solder ball array according to the present invention. Tool 20 is illustrated in three segments, but it is to be understood that each segment represents a different tool. A method of aligning and sizing a solder ball according to the present invention includes placing tool 20 containing first depression 24, or containing an array of first depression 24 within substrate 22 over solder ball 12 or a BGA. Where solder ball 12 is misaligned, as illustrated within first depression 24, solder ball 12 will be pushed by depression wall 32 substantially in a direction toward the center of first depression 24. First depression 24 has a depression size smaller than first depression but greater than second depression 26. Second depression 26 has a depression size smaller than first depression 24 but greater than Nth depression 30. In the inventive method, a plurality of tools having an array of depressions, each tool having a depression size smaller than the previous, the series of tools is applied progressively to a solder ball array to substantially realign and reshape solder balls that are misaligned. Where a tool has an array with Nth depression 30 as the final tool in a series of tools, Nth depression 30 will have a width that is substantially the design width of solder ball 12.

It can be appreciated that any configuration of tools may be used in the inventive method that includes any configuration or combination of tools illustrated in FIGS. 4–11 including combination and/or elimination of individual features set forth herein. Thus, a plurality of tools may include, for example vented corral tool 50 as a first tool applied to a solder ball array, wherein each solder ball 12 in the solder ball array is substantially larger than design. As a series of progressively smaller depression tools is applied to the solder ball array, solder ball 12 is realigned by the tool, and is size reduced, where necessary, by reflow of solder material into any of wetting channel 52, second wetting channel 56, wall diagonal wetting channel 60, and the like.

FIG. 12 also illustrates an alternative method in assisting the realignment and reshaping of solder ball 12. A heating gradient Q+ is applied to integrated circuit package 10 and a cooling gradient Q− is applied to tool 20. As depression wall 32 contacts solder ball 12, a shear force upon solder ball 12 between tool upper surface 46 and lower surface 14 of integrated circuit package 10 causes solder ball 12 to move in a direction substantially toward the center of first depression 24. Heating gradient Q+ assists in facilitating the lowering of the shear force required to allow solder ball 12 to move into a reshaped form. Cooling gradient Q− assists in causing solder ball 12 to be reshaped into a form substantially that of the depression that is covering it. Heating gradient Q+ and cooling gradient Q− may be used simultaneously or in succession. Heating gradient Q+ and cooling gradient Q− may be applied before, during, or after pressing, or a combination thereof including all three. Where the thermal budget of a die within integrated circuit package 10 is substantially expended, application of tool 20 to integrated circuit package 10 and solder ball 12 can be done without imposing heating gradient Q+ to integrated circuit package 10. Where solder ball 12 is substantially larger than an intended design in order to accommodate warpage and bowing problems, heating gradient Q+ may be applied to tool 20 (not illustrated) and excess solder material may reflow into corral 42 when present, or into wetting channel 52 when present, where overflow exceeds the volume of corral 42 and/or the depression.

Figure 1:
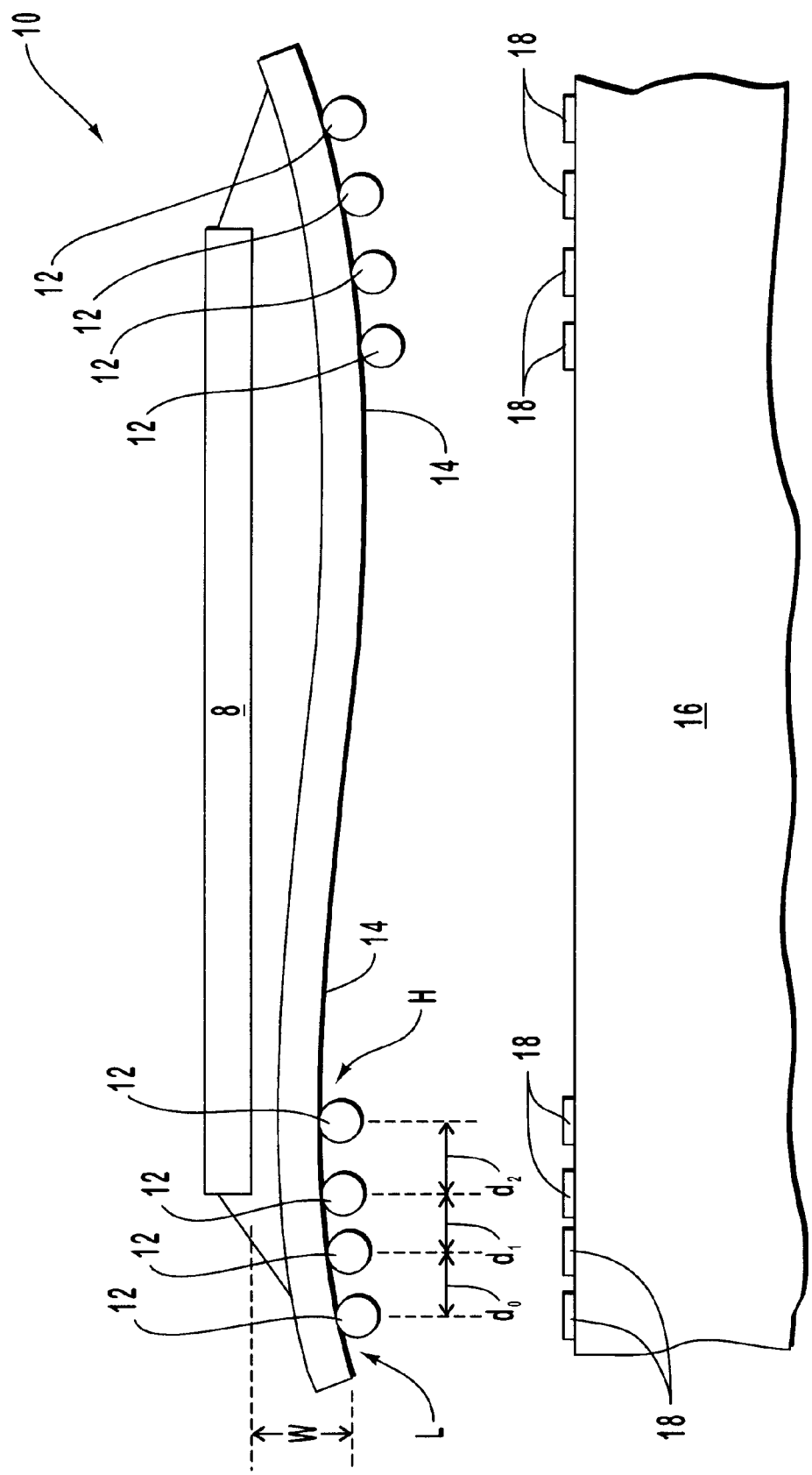
FIG. 1 is an elevational cross-section view of problems that occur in the field of chip packaging in attempting to achieve a substantially uniform and planar array of electrically conductive elevations such as a ball grid array.

It can now be appreciated that use of the inventive tool overcomes the problems in the prior art depicted in FIG. 1 and as otherwise described. Application of a single tool to integrated circuit package 10, or a series of tools thereto will substantially reduce the size of solder ball 12 in the area of low spot L by removing solder ball material without flattening it and without causing an electrical short between solder balls in that region, and removing substantially no solder ball material in high spot H thereof.

Figure 13:
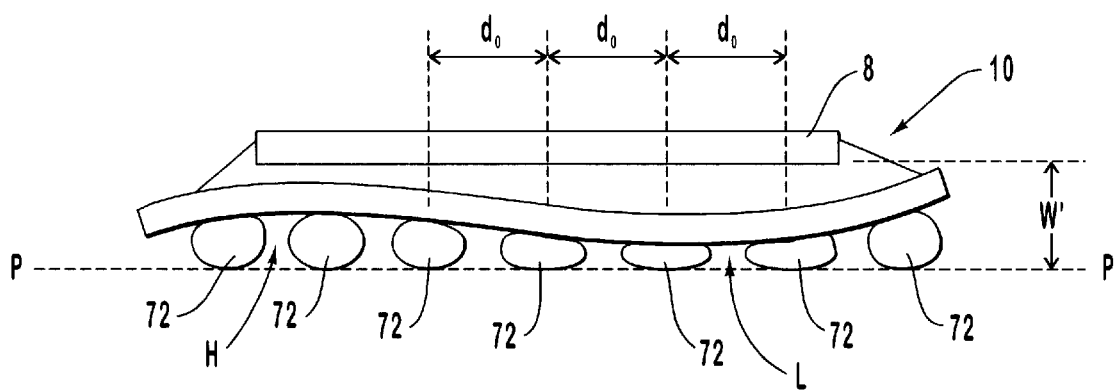
FIG. 13 is an elevational cross-section view of possible results of application of the inventive tool and method, wherein a ball grid array as part of a warped integrated circuit package has been realigned and reshaped to achieve substantial planarity and substantial design alignment.

FIG. 13 represents embodiments of the present invention as they affect a BGA that required substantial realignment and reshaping. In FIG. 13, it can be seen that integrated circuit package 10 as similarly illustrated in FIG. 1 has been processed by the inventive method with at least one embodiment of the inventive tool. Solder ball 12 has been substantially reshaped or reduced in volume or both. The variation of warpage W' is substantially reduced as compared to warpage W in FIG. 1 where the planarity, represented by the dashed line P—P, is substantially flat. It can be seen that in some embodiments, a reduced profile solder ball 70 will result wherein solder ball 12 has been substantially reshaped with substantial removal of solder ball material or with substantial realignment of solder ball material, or both. In applications where it is known that the planarity of an integrated circuit package is problematic, a vented tool may be used to achieve reduced profile solder ball 70. Thus, the illustration of FIG. 13 depicts at least two embodiments of the present invention wherein a solder ball 72 has a substantially unchanged profile without removal of solder ball material, and wherein reduced solder ball 72 has a substantially reduced volume and profile that was necessitated to achieve planarity without causing shorting of a given solder ball into a neighboring solder ball. An embodiment of the inventive tool may include both profile-reducing qualities and volume-reducing qualities separately or in combination.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of reshaping an electrically conductive elevation comprising:

providing a device composed of a plurality of said electro conductive elevations;

providing a substrate having a first and a second depression therein; and pressing said first depression over and in contact with a surface of one of said electrically conductive elevations to change the shape of the surface of the electrically conductive elevation, said first depression having a concave surface; followed by pressing a second depression having a concave surface over and in contact with another of said electrically conductive elevations to change the shape of the surface of the electrically conductive elevation, the concave surface of the second depression being different in shape than that of the concave surface of the first depression.

2. A method of reshaping an electrically conductive elevation according to claim 1, wherein pressing said first and said second depressions is performed until a selected shape of said surface on said electrically conductive elevation is accomplished.

3. A method of reshaping an electrically conductive elevation according to claim 2, further comprising removing said depression from said surface on said electrically conductive elevation.

4. A method of reshaping an electrically conductive elevation according to claim 1, further comprising, before pressing said first and said second depressions, aligning said first and said second depressions with said electrically conductive elevation.

5. A method of reshaping an electrically conductive elevation according to claim 1, wherein said substrate has a first upper surface, and wherein said first depression is in said first upper surface, said first depression having a bottom and a wall, said wall having a first angle with respect to said first upper surface, said wall substantially defining a wall surface between said first upper surface and said bottom, and said first depression having a width measured at said first upper surface, and wherein pressing said first depression presses said electrically conductive elevation against said wall surface and said bottom to reshape the electrically conductive elevation.

6. A method of reshaping an electrically conductive elevation according to claim 1, wherein the shape of the concave surface of the second depression is smaller in width than that of the shape of the concave surface of the first depression.

7. A method of reshaping an electrically conductive elevation according to claim 1, further comprising:

heating said electrically conductive elevation.

8. A method of reshaping an electrically conductive elevation according to claim 7, wherein said electrically conductive elevation substantially achieves its solidus temperature.

9. A method of reshaping an electrically conductive elevation according to claim 7, wherein said electrically conductive elevation substantially achieves below about 95% of its solidus absolute temperature.

10. A method of reshaping an electrically conductive elevation according to claim 7, wherein said electrically conductive elevation substantially achieves below about 97% of its solidus absolute temperature.

11. A method of reshaping an electrically conductive elevation according to claim 7, wherein said electrically conductive elevation substantially achieves its plastic reflow temperature under gravity.

12. A method of reshaping a plurality of electrically conductive elevations comprising:

providing a substrate having a depression therein, wherein said substrate has a first upper surface, and wherein said depression is below said first upper surface, said depression having a bottom and a wall, said wall having a first angle with respect to said first upper surface, said wall substantially defining a wall surface between said first upper surface and said bottom, and said depression having a width measured at said first upper surface;

aligning said depression with one of said electrically conductive elevations of which said electrically conductive elevation on a device is substantially composed;

heating said one of said electrically conductive elevations to substantially achieve a solidus temperature thereof;

pressing said depression over and in contact with a surface on said one of said electrically conductive elevations against said wall surface and said bottom until a first shape of said surface on said one of said electrically conductive elevations is accomplished;

removing said depression from said surface on said one of said electrically conductive elevations; and pressing a second depression over another of said electrically conductive elevations until a second shape of said surface on said another of said electrically conductive elevations is accomplished, the first shape being different from the second shape.

13. A method of reshaping a plurality of electrically conductive elevations according to claim 12, wherein said depression has a vent therein having a vent opening that opens into said first upper surface; and wherein pressing said depression over and in contact with said surface on said one of said electrically conductive elevations forces a portion of said one of said electrically conductive elevations into said vent.

* * * * *

UNITED STATES PATENT AND TRADEMARK OFFICE
CERTIFICATE OF CORRECTION

PATENT NO. : 5,984,164
DATED : Nov. 16, 1999
INVENTOR(S) : James M. Wark

It is certified that error appears in the above-identified patent and that said Letters Patent are hereby corrected as shown below:

Col. 7, line 47, after "and" insert --is--

Col. 11, line 61, after "said" change "electro" to --electrically--

Col. 12, lines 16 and 17, after "removing" change "said depression" to --said first and said second depressions--

Signed and Sealed this

Tenth Day of April, 2001

Attest:

NICHOLAS P. GODICI

*Attesting Officer*     *Acting Director of the United States Patent and Trademark Office*